US008433026B2

(12) United States Patent
Ballantyne et al.

(10) Patent No.: US 8,433,026 B2
(45) Date of Patent: Apr. 30, 2013

(54) MULTI-RATE DIGITAL PHASE LOCKED LOOP

(75) Inventors: Gary John Ballantyne, Christchurch (NZ); Jifeng Geng, San Diego, CA (US); Daniel F. Filipovic, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 936 days.

(21) Appl. No.: 12/478,506

(22) Filed: Jun. 4, 2009

(65) Prior Publication Data

US 2010/0310031 A1 Dec. 9, 2010

(51) Int. Cl.
*H03D 3/24* (2006.01)

(52) U.S. Cl.
USPC ........... 375/376; 329/307; 329/325; 329/360; 332/127; 342/103; 375/215; 375/294; 375/327; 375/373

(58) Field of Classification Search .................. None
See application file for complete search history.

(56) References Cited

U.S. PATENT DOCUMENTS

| 7,498,890 B2 | 3/2009 | Wallberg et al. | |
|---|---|---|---|
| 2007/0189431 A1* | 8/2007 | Waheed et al. | 375/376 |
| 2008/0072025 A1 | 3/2008 | Staszewski et al. | |
| 2008/0317188 A1 | 12/2008 | Staszewski et al. | |

OTHER PUBLICATIONS

Heidari M E, et al., "All-digital out-phasing modulator for a software-defined transmitter" VLSI Circuits, 2008 IEEE Symposium on, IEEE, Piscataway, NJ, USA, Jun. 18, 2008, pp. 98-99, XP031295817 ISBN: 978-1-4244-1804-6 .Section II. Transmitter Architecture; p. 98; figure 2.
Heidari M E et al: "All-digital out-phasing modulator for a software-defined transmitter" VLSI Circuits, 2008 IEE Symposium on, IEEE, Piscataway, NJ, USA Jun. 18, 2008, pp. 98-99, XP031295817 ISBN: 978-1-4244-1804-6 Section II Transmitter.
International Search Report and Written Opinion—PCT/US2010/037530, International Search Authority—European Patent Office—Sep. 2, 2010.

* cited by examiner

*Primary Examiner* — David C. Payne
*Assistant Examiner* — Adolf Dsouza
(74) *Attorney, Agent, or Firm* — S. Hossain Beladi

(57) ABSTRACT

A Digital Phase-Locked Loop (DPLL) involves a Time-to-Digital Converter (TDC) that receives a Digitally Controlled Oscillator (DCO) output signal and a reference clock and outputs a first stream of digital values. The TDC is clocked at a high rate. Downsampling circuitry converts the first stream into a second stream. The second stream is supplied to a phase detecting summer of the DPLL such that a control portion of the DPLL can switch at a lower rate to reduce power consumption. The DPLL is therefore referred to as a multi-rate DPLL. A third stream of digital tuning words output by the control portion is upsampled before being supplied to the DCO so that the DCO can be clocked at the higher rate. In a receiver application, no upsampling is performed and the DCO is clocked at the lower rate.

30 Claims, 8 Drawing Sheets

DIGITAL PHASE-LOCKED LOOP IN LOCAL OSCILLATOR IN TRANSMITTER

DIGITAL PHASE-LOCKED LOOP

DIGITAL PHASE-LOCKED LOOP IN LOCAL
OSCILLATOR IN TRANSMITTER

L(z)
(INCREASE SAMPLE RATE USING INTERPOLATION)

$$y'_0 = y_0$$

$$y'_1 = y_0 + \frac{1}{4} * (y_4 - y_0)$$

$$y'_2 = y_0 + \frac{2}{4} * (y_4 - y_0)$$

$$y'_3 = y_0 + \frac{3}{4} * (y_4 - y_0)$$

L(z)
(INCREASE SAMPLE RATE USING INTERPOLATION)

H(z)
(DECREASE SAMPLE RATE USING ESTIMATION)

$$y'_3 = \frac{y_0}{5} + \frac{y_1}{10} + \frac{2y_2}{5} + \frac{7y_3}{10}$$

H(z)
(DECREASE SAMPLE RATE USING ESTIMATION)

$$D(z) = z^{-4}$$

PHASE MARGIN AS A FUNCTION OF DELAY (δ)

| FREQUENCY (XO=19.2 MHZ) | PHASE RMS ERROR (DEGREES) | PHASE PEAK ERROR (DEGREES) |
|---|---|---|
| XO | 0.16 | 0.41 |
| XO/4 | 0.10 | 0.43 |
| XO/16 | 0.41 | 1.28 |

MULTI-RATE DIGITAL PHASE LOCKED LOOP

BACKGROUND INFORMATION

1. Technical Field

The disclosed embodiments relate to Digital Phase-Locked Loops (DPLLs).

2. Background Information

FIG. 1 (Prior Art) is a block diagram of a type of local oscillator 1 that sees use in generating a Local Oscillator (LO) signal within a radio transmitter. The LO may, for example, be supplied to a mixer in a transmit chain of the transmitter such that a baseband signal is upconverted in frequency for later transmission. Local oscillator 1 includes a Digital Phase-Locked Loop (DPLL) 2 followed by a programmable divider 3. DPLL 2 implements two-point modulation so that the PLL output can be modulated faster than the PLL loop bandwidth. An incoming modulating signal M(t) is provided to both a low pass modulation path and to a high pass modulation path. M(t) may, for example, be a stream of twelve-bit digital values. In the low pass modulation path, a digital summer 4 receives the modulating signal M(t) along with a relatively static channel frequency command word (FCW). The FCW may, for example, be a twenty-bit digital value. The FCW sets the center frequency of the channel to be used for transmission, whereas M(t) represents the information to be communicated. The sum of M(t) and the FCW is supplied to a reference phase accumulator 5. The value by which accumulator 5 increments on each rising edge of a clock signal of frequency $f_{clk}$ is the multi-bit value output by summer 4. The accumulation performed by reference phase accumulator 5 essentially converts frequency to phase. In the high pass modulation path, a scaling unit 6 receives and scales the modulating signal M(t) with a scaling factor K and provides a second modulating signal F(t). A Digitally Controlled Oscillator (DCO) 7 receives a stream of digital tuning control words S(t). DCO 7 outputs a signal DCO_OUT whose frequency is determined by the digital tuning word. For each different digital tuning word value DCO 7 might be receiving, the DCO_OUT signal has a different one of sixteen different discrete frequencies. DCO 7 may, for example, receive a reference clock signal of frequency $f_{dco}$ such that the DCO changes the frequency of DCO_OUT synchronously with respect to $f_{dco}$. The frequencies that DCO_OUT may be controlled to have may, for example, vary within a band around four gigahertz. A Time-to-Digital Converter (TDC) 8 receives the DCO_OUT signal and a reference clock signal REF, and outputs a multi-bit digital signal X(t) whose value is proportional to the phase difference between the two signals. TDC 8 outputs one such X(t) value each period of the $f_{tdc}$ signal. A second summer 9 subtracts the feedback phase signal value X(t) from the modulating phase signal value P(t), thereby generating a phase error signal value E(t). A loop filter 10 filters the phase error signal. A third summer 11 sums the filtered phase error signal and the second modulating signal F(t). The output of third summer 11 is the stream of digital tuning words S(t) supplied to DCO 7. Programmable divider 3 divides the DCO_OUT signal by either two or four, depending on the band of operation, to output the Local Oscillator signal LO.

Although the DPLL of FIG. 1 may work well in a cellular telephone transmitter application, the frequency of the signal DCO_OUT changes at discrete times. These discrete times are generally equally spaced in time. This introduces what are known as "digital images". These digital images are spectral components of the local oscillator output signal LO that are not at the desired LO main frequency. As the frequency $f_{dco}$ increases, the digital images move farther away in frequency from the LO main frequency, and the digital images decrease in power. Increasing the frequency $f_{dco}$ therefore reduces the digital image noise problem. For most cellular telephone protocols, there is a specification that sets the maximum noise allowed outside the channel in which the cellular telephone is to be transmitting. The frequency $f_{dco}$ is therefore kept high enough to satisfy the specification for the amount of phase noise allowed. In addition to introducing digital images into the LO signal, DPLL 2 can introduce quantization noise into the LO signal. As DPLL 2 operates, TDC 8 quantizes the phase difference between edges of the DCO_OUT signal and corresponding edges of the REF signal, and this quantization gives rise to quantization noise. If there is too much quantization noise, then the spectral purity of the LO signal is compromised to an unacceptable degree. Accordingly, TDC 8 is generally clocked at a high rate $f_{tdc}$. Rate $f_{tdc}$ may, for example, be of the same rate $f_{dco}$ at which DCO 7 is clocked. Unfortunately, running DPLL 2 at these high rates can cause the DPLL to consume an undesirably large amount of power.

SUMMARY

A two-point modulated Digital Phase-Locked Loop (DPLL) includes a Time-to-Digital Converter (TDC), downsampling circuitry, a Digitally Controlled Oscillator (DCO), upsampling circuitry, and a remaining amount of control circuitry. The TDC receives a DCO output signal from the DCO and generates a first stream of digital values. The digital values of the first stream are output from the TDC at a first frequency. This first frequency is referred to as a "first sample rate." The downsampling circuitry receives the first stream and outputs a second stream of digital values. The digital values of the second stream are output from the downsampling circuit at a second lower frequency. This second frequency is referred to as a "second sample rate."

The second stream is supplied to a phase detecting summer of the remaining amount of DPLL control circuitry. The remaining amount of control circuitry is clocked and switches at the second sample rate. The remaining amount of control circuitry outputs a third stream of digital tuning words. The digital tuning words of the third stream are also output at the second sample rate. Operation of this amount of control circuitry at the second lower frequency reduces power consumption of the DPLL.

The upsampling circuitry receives the third stream and supplies a fourth stream of digital tuning words to the DCO at the higher first sample rate. In response to receiving the fourth stream of digital tuning words at the higher first sample rate, the DCO changes the frequency of the DCO output signal at the first sample rate. Operating the DCO at the higher first sample rate allows digital images in the DPLL output signal to be reduced to acceptable levels.

Due to the upsampling circuitry and the downsampling circuitry, different parts of the DPLL are operated at different sample rates. The DPLL is therefore referred to as a "multi-rate DPLL." The DCO is operated at the higher sample rate (the first frequency) to reduce digital images. The TDC is operated at the higher sample rate to reduce quantization noise. The remaining amount of control circuitry (other than the DCO, the TDC, the downsampling circuitry, and the upsampling circuitry) is operated at the lower sample rate (the second frequency) to reduce DPLL power consumption as compared to a DPLL of conventional design where the entire DPLL is operated at the higher sample rate of the DCO and TDC.

In one exemplary transmitter application, a modulating signal and a channel frequency command word are supplied to the amount of control circuitry. The DCO is operated at the higher sample rate in order to reduce digital images. The TDC is operated at the higher sample rate in order to reduce quantization noise. In one exemplary receiver application, on the other hand, digital images are less of a problem. In the receiver application, no upsampling circuitry is provided in the DPLL and the DCO is operated at the lower sample rate, thereby further reducing power consumption. Accordingly, depending on the application to which the multi-rate DPLL is to be put, the sample rate of the DOC can be made to be either higher than, equal to, or lower than the sample rate of the TDC.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 2:
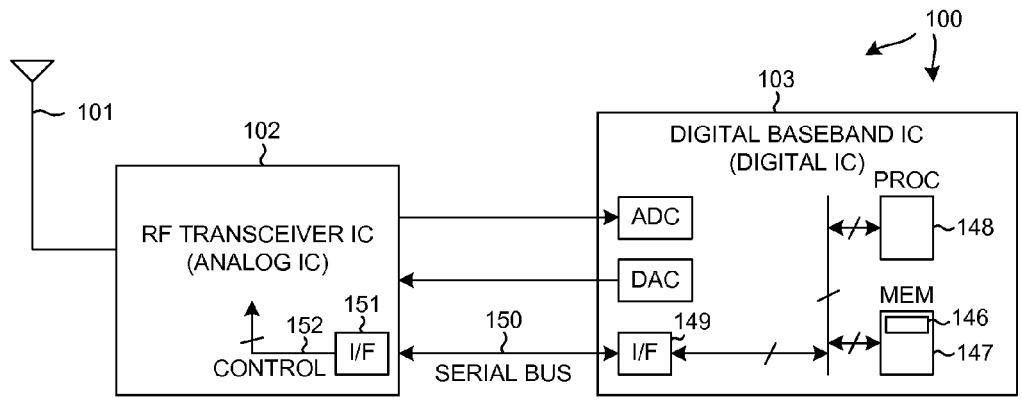
FIG. 2 is a simplified diagram of a mobile communication device 100 that employs a multi-rate DPLL in accordance with one novel aspect.

FIG. 2 is a very simplified high level block diagram of a mobile communication device 100 such as a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 1:
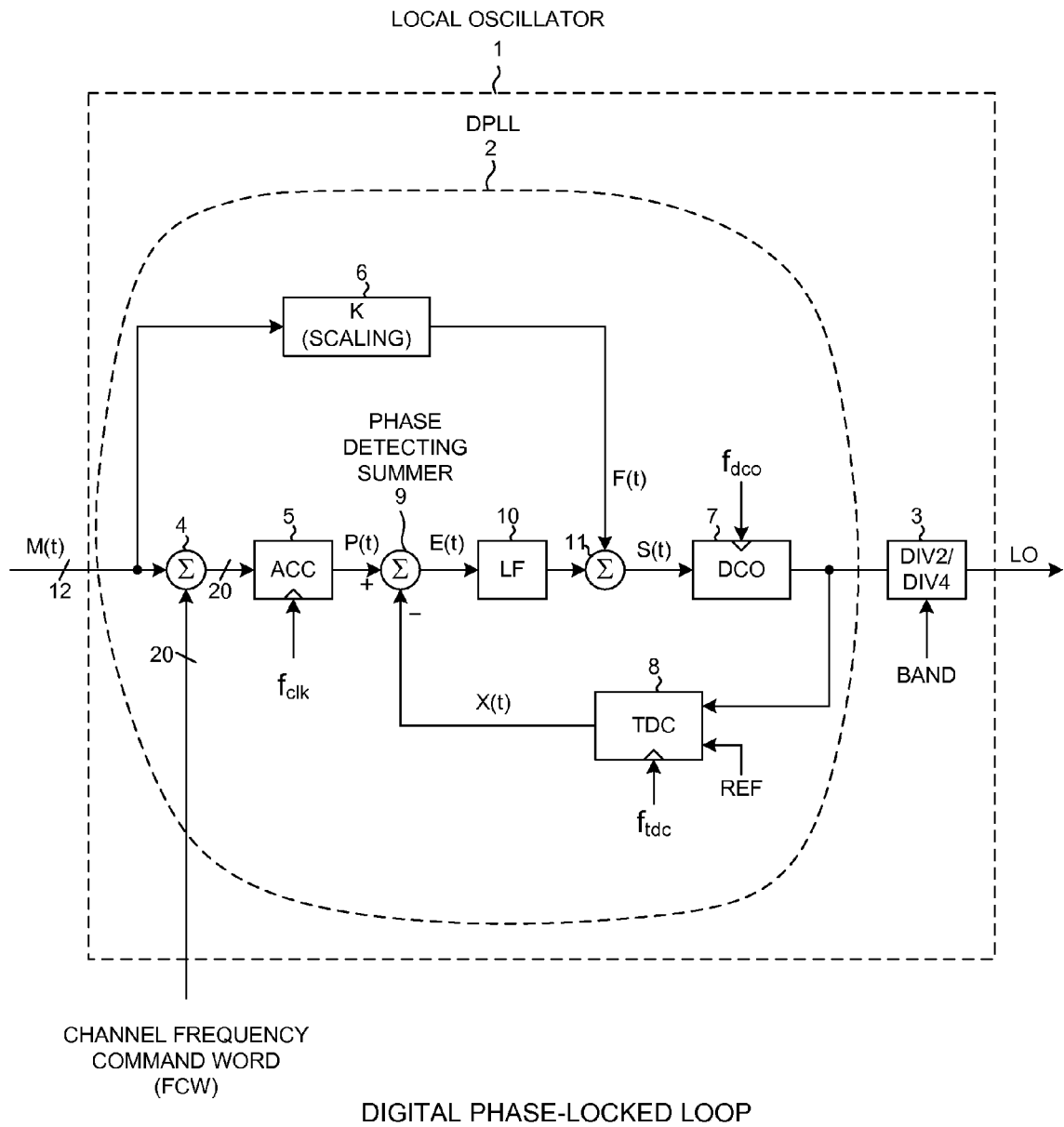
FIG. 1 (Prior Art) is a diagram of a conventional two-point modulated Digital Phase-Locked Loop (DPLL) within a local oscillator.
Figure 3:
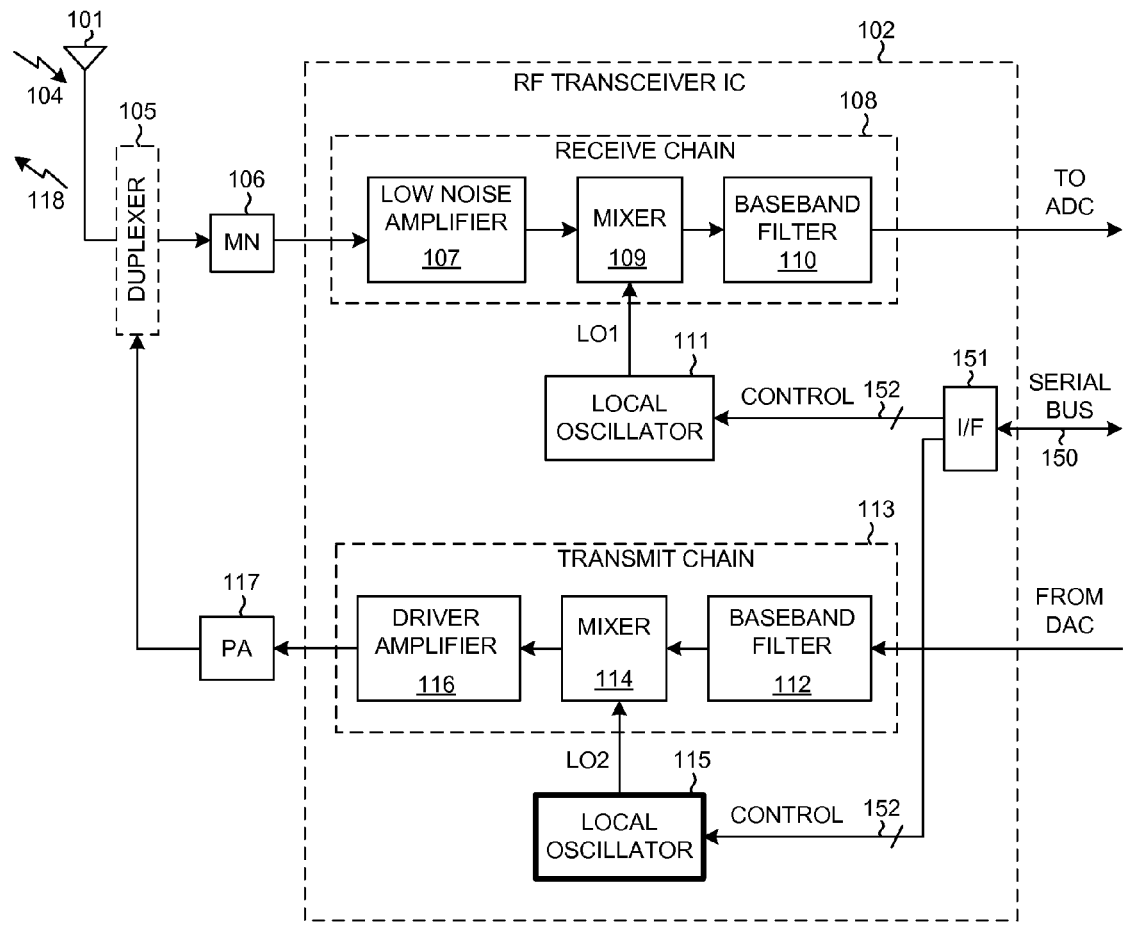
FIG. 3 is a more detailed diagram of RF transceiver integrated circuit 102 of FIG. 2.

FIG. 3 is a more detailed diagram of the RF transceiver integrated circuit 102 of FIG. 1. In one very simplified explanation of the operation of the cellular telephone, if the cellular telephone is being used to receive audio information as part of a cellular telephone conversation, then an incoming transmission 104 is received on antenna 101. The signal passes through duplexer 105 and a matching network 106 and is amplified by a Low Noise Amplifier (LNA) 107 of a receive chain 108. After being downconverted in frequency by a mixer 109 and after being filtered by baseband filter 110, the information is communicated to the digital baseband integrated circuit 103 for analog-to-digital conversion and further processing in the digital domain. How the receive chain downconverts is controlled by changing the frequency of a local oscillator signal LO1 generated by local oscillator 111. If, on the other hand, the cellular telephone 100 is being used to transmit audio information as part of a cellular telephone conversation, then the audio information to be transmitted is converted into analog form in digital baseband integrated circuit 103. The analog information is supplied to a baseband filter 112 of a transmit chain 113 of RF transceiver integrated circuit 102. After filtering, the signal is upconverted in frequency by mixer 114. The upconversion process is tuned and controlled by controlling the frequency of a local oscillator signal LO2 generated by local oscillator 115. The resulting upconverted signal is amplified by a driver amplifier 116 and an external power amplifier 117. The amplified signal is supplied to antenna 101 for transmission as outgoing transmission 118. The local oscillators 111 and 115 of the receive and transmit chains are controlled by control information received from digital baseband integrated circuit 103 by a serial bus 150.

Figure 4:
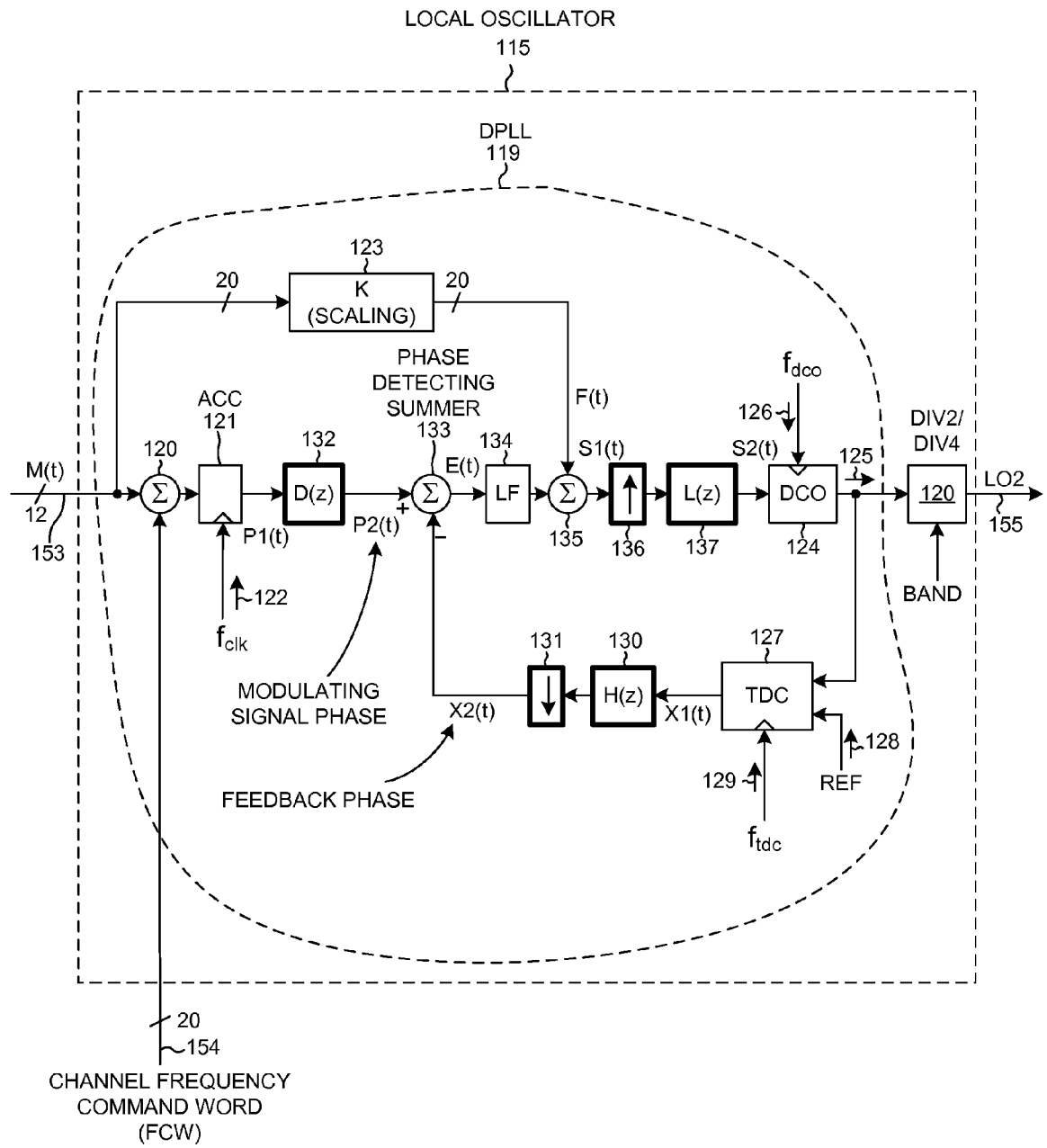
FIG. 4 is a diagram a multi-rate two-point modulated Digital Phase-Locked Loop (DPLL) 119 in accordance with one novel aspect.

FIG. 4 is a more detailed diagram of local oscillator 115 of the transmit chain 113 in the RF transceiver integrated circuit 102 of FIG. 3. Local oscillator 115 receives information to be modulated M(t) on input conductors 153. M(t) in this example is a stream of twelve-bit digital values that represents the information to be communicated. Local oscillator 115 also receives a channel frequency command word (FCW) that determines in which one of many different frequency bands or channels the modulation will occur. FCW in the present example is a twenty-bit digital value received on input conductors 154. Local oscillator 115 uses this input information to generate the local oscillator signal LO2. Signal LO2 is a single-bit digital signal that is output onto conductor 155.

As illustrated in FIG. 4, local oscillator 115 includes a Digital Phase-Locked Loop (DPLL) 119 followed by a programmable divider 120. DPLL 119 implements two-point modulation so that the phase control loop of DPLL 119 can be modulated faster than loop bandwidth. Incoming modulating signal M(t) is provided to both a low pass modulation path and to a high pass modulation path. In the low pass modulation path, a digital summer 120 receives the modulating signal M(t) on conductors 153 along with the relatively static channel frequency command word (FCW) on conductors 154. The sum of M(t) and the FCW is a stream of twenty-bit values. This stream is supplied to a reference phase accumulator 121. The value by which accumulator 121 increments on each rising edge of an accumulator clock signal 122 of frequency $f_{clk}$ is the multi-bit value output by summer 120. The accumulation performed by reference phase accumulator 121 essentially converts frequency to phase. In the high pass modulation path, a scaling unit 123 receives and scales the modulating signal M(t) with a scaling factor K and outputs a second modulating signal F(t). In this example, F(t) is a stream of twenty-bit values. A Digitally Controlled Oscillator (DCO) 124 receives a stream of digital tuning control words S2(t). In this example, S2(t) is a stream of four-bit digital tuning words. For each different digital tuning word value, DCO 124 outputs the DCO_OUT signal 125 to have a corresponding one of sixteen corresponding different discrete frequencies. DCO 124 changes the frequency of DCO_OUT synchronously with respect to a DCO clock signal 126 of frequency $f_{dco}$. The sixteen frequencies that DCO_OUT may be controlled to have are closely spaced and are of approximately four gigahertz. In one example, DCO 124 involves a Digital-to-Analog Converter (DAC) followed by VCO, where the analog output of the VCO is a clipped signal.

A Time-to-Digital Converter (TDC) 127 receives the DCO_OUT signal 125 and a reference clock signal REF 128, and outputs a multi-bit digital signal X1(t). For each edge of DCO_OUT and each corresponding edge of the REF signal 128, TDC 127 outputs a four-bit digital value X1(t). The four-bit digital value X1(t) is proportional to the phase difference between the signal edges. TDC 127 outputs one such X1(t) value each period of a TDC clock signal 129 of frequency $f_{tdc}$. The rate that the values of X1(t) are generated is referred to here as the "sample rate." In the present example, the REF signal 128 is generated by a crystal oscillator and has a frequency of 19.2 MHz.

A downsampling estimator circuit 130 and 131 receives the X1(t) signal and decreases the sample rate by a factor of four as explained in further detail below to generate an output phase signal X2(t) having a lower sample rate. In the present example, downsampling estimator circuit 130 and 131 generates four-bit digital values. Each of these four-bit values is made to be the four most significant bits of a twenty-bit value. The least significant sixteen bits of each X2(t) value are zeros. The stream of X2(t) values is therefore a stream of twenty-bit digital values.

The stream P1(t) of twenty-bit digital values output by reference phase accumulator 121 is filtered by digital filter block D(z) 132 to generate a modulating signal phase signal P2(t). In the present example, D(z) is simply a delay of four clock cycles of the accumulator clock signal 122 of frequency $f_{clk}$. D(z) receives a twenty-bit value and outputs the twenty-bit values four clock cycles later as a twenty-bit P2(t) value.

A phase detecting summer 133 subtracts each twenty-bit output phase signal X2(t) value from each corresponding twenty-bit phase signal P2(t) value, thereby generating a twenty-bit phase error signal value E(t). A loop filter 134 filters the phase error signal. A third summer 135 sums the filtered phase error signal and the second modulating signal F(t). The output of third summer 135 is a stream of twenty-bit digital tuning words S1(t). There is one S1(t) value for each X2(t) value. The sample rate of S1(t) signal is then increased by a factor of four by an upsampling interpolator circuit 136 and 137 as explained in further detail below to generate the stream of four-bit digital tuning words S2(t) for DCO 124. In this example, there are four S2(t) values for each incoming S1(t) value. The sample rate of S2(t) is four times the sample rate of S1(t). Programmable divider 120 divides the DCO_OUT signal 125 by either two or four, depending on the band of operation, to output the local oscillator signal LO2 on conductor 155.

Figure 5:
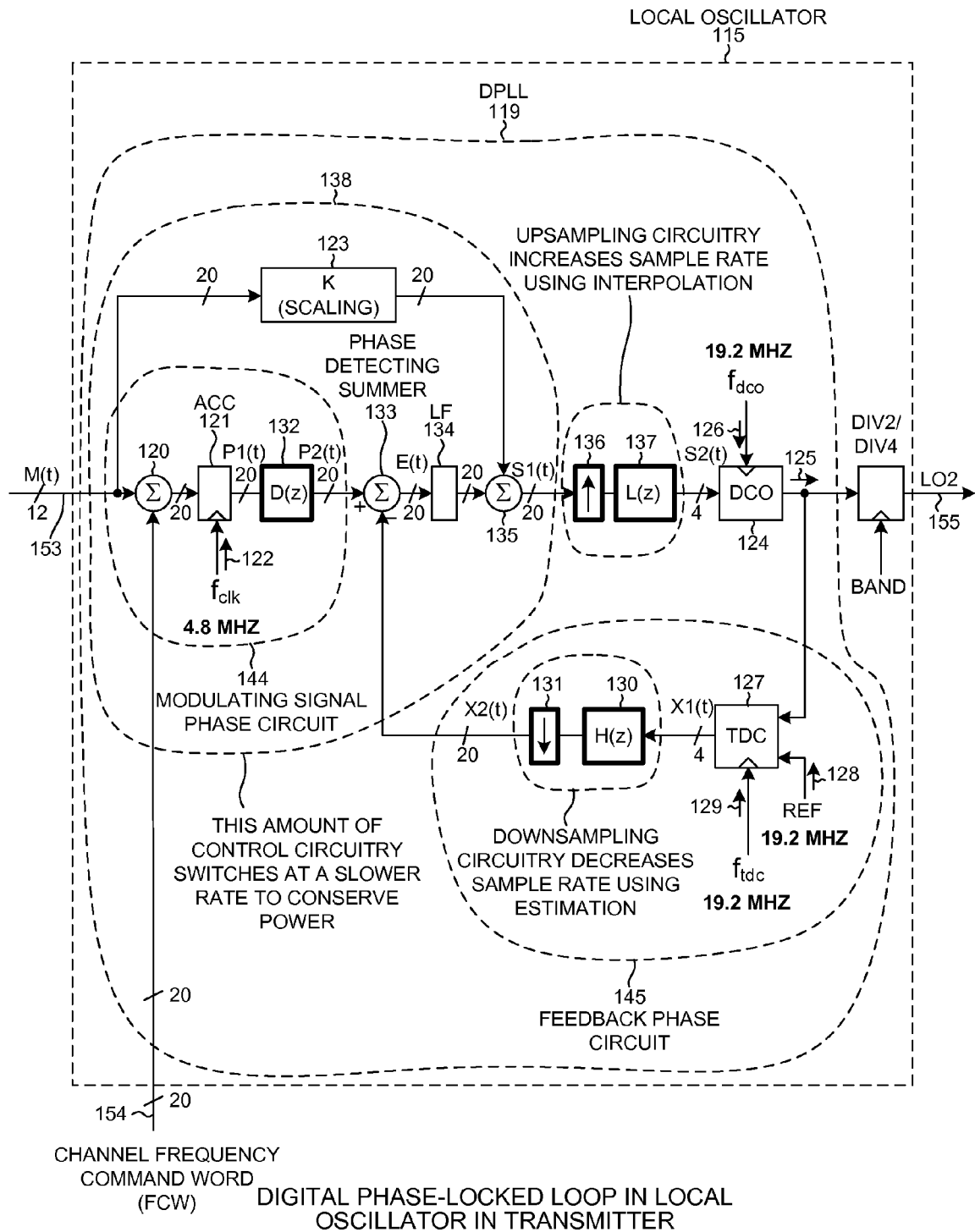
FIG. 5 is a diagram that identifies various portions of the multi-rate DPLL 119 of FIG. 4.

FIG. 5 is a diagram that identifies various functional parts of DPLL 119. The summer 120, accumulator 121 and digital filter 132 together are referred to as a modulating signal phase circuit 144. The modulating signal phase circuit 144 receives the modulating signal M(t) and the channel frequency command word (FCW) and outputs the modulating signal phase signal P2(t) to the phase detecting summer 133. TDC 127 and downsampling circuitry 130 and 131 together are referred to as a feedback phase circuit 145. The feedback phase circuit 145 receives the DCO output signal 125 and the reference signal REF 128 and outputs the feedback phase signal X2(t) to phase detecting summer 133. Downsampling estimator circuitry 130 and 131 decreases the sample rate of the X1(t) signal output from TDC 127 by a factor of four, and upsampling interpolator circuitry 136 and 137 increases the sample rate of the S1(t) signal by a factor of four, such that the remaining amount of control circuitry 138 can switch at a rate that is substantially lower than the rate at which DCO 124 and TDC 127 are clocked. In this example, DCO 124 is clocked at 19.2 MHz by DCO clock signal 126, and TDC 127 is also clocked at 19.2 MHz by TDC clock signal 129, whereas control circuitry 138 switches at a much lower 4.8 MHz. Note that phase accumulator 121 is clocked by the 4.8 MHz accumulator clock signal 122. Reducing the sample rate at which control circuitry 138 is operating from 19.2 MHz (as would be conventional) down to 4.8 MHz in accordance with the multi-rate scheme described here serves to reduce DPLL power consumption. DCO 124 and TDC 127 are clocked at the higher 19.2 MHz rate, however, in order to reduce the magnitude of digital images and in order to reduce quantization noise.

Figures 6, 7:
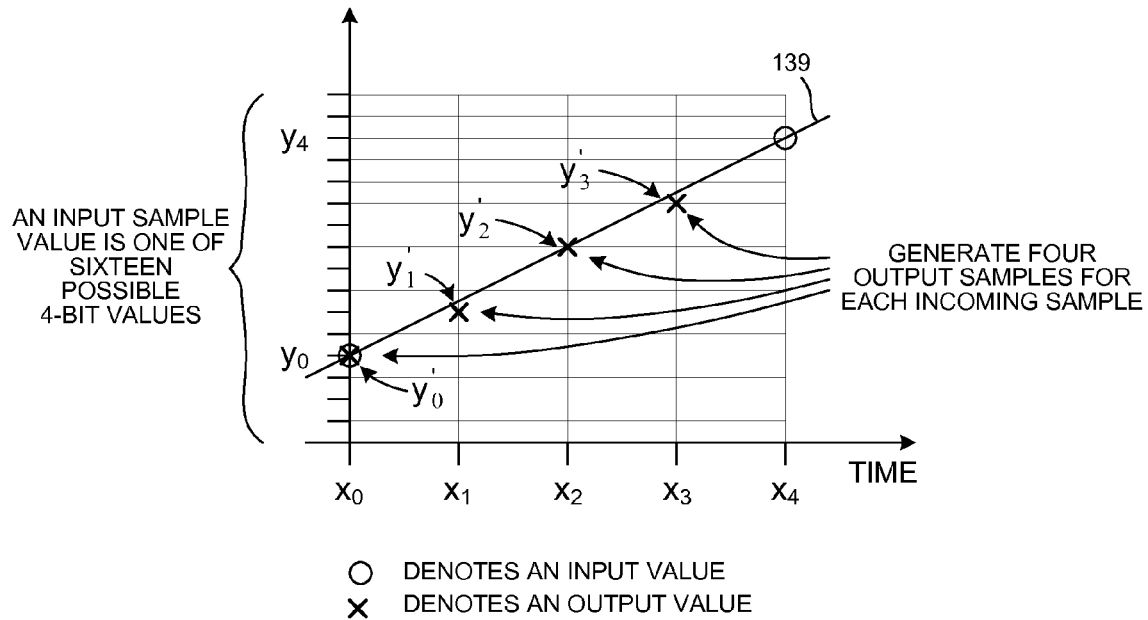
FIG. 6 is a diagram that illustrates an operation of one example of the upsampling circuitry 136 and 137 of the multi-rate DPLL 119 of FIG. 4.
FIG. 7 sets forth equations usable to perform the upsampling operation performed by upsampling circuitry 136 and 137 of the multi-rate DPLL 119 of FIG. 4.

FIG. 6 is a diagram that illustrates an operation of one example of upsampling circuitry 136 and 137. Upsampling circuitry 136 and 137 receives a lower sample rate signal S1(t) and outputs a higher sample rate signal S2(t). Each incoming S1(t) value is a four-bit value (the four most significant bits of the output of summer 135). An incoming S1(t) value can therefore have one of the $2^4$ values indicated on the vertical axis of the graph of FIG. 6. In the illustrated example, the $y_0$ value and the $y_4$ values are two consecutively received S1(t) four-bit values. Four S2(t) values $y'_0$, $y'_2$, $y'_3$ and $y'_4$ are generated by interpolating a straight line 139 between incoming values $y_0$ and $y_4$. The "L" in L(z) refers to Lagrangian interpolation. The determined equation for line 139 is usable to generate additional y values on the line for other x times between the two x times for the two consecutive input S1(t) values. After the four y values for S2(t) have been generated, the process is repeated using $y_4$ and the next successive S1(t) value as input values.

FIG. 7 sets forth FIR filter functions usable to generate the four S2(t) values. These FIR filter functions are implemented in hardware in upsampling circuitry 136 and 137. The up-arrow symbol block 136 and the L(z) symbol block 137 are just schematic representations of the function being performed. In reality there is one hardware circuit of combinatorial logic that carries out the operations set forth in equation form in FIG. 7.

Figures 8, 9:
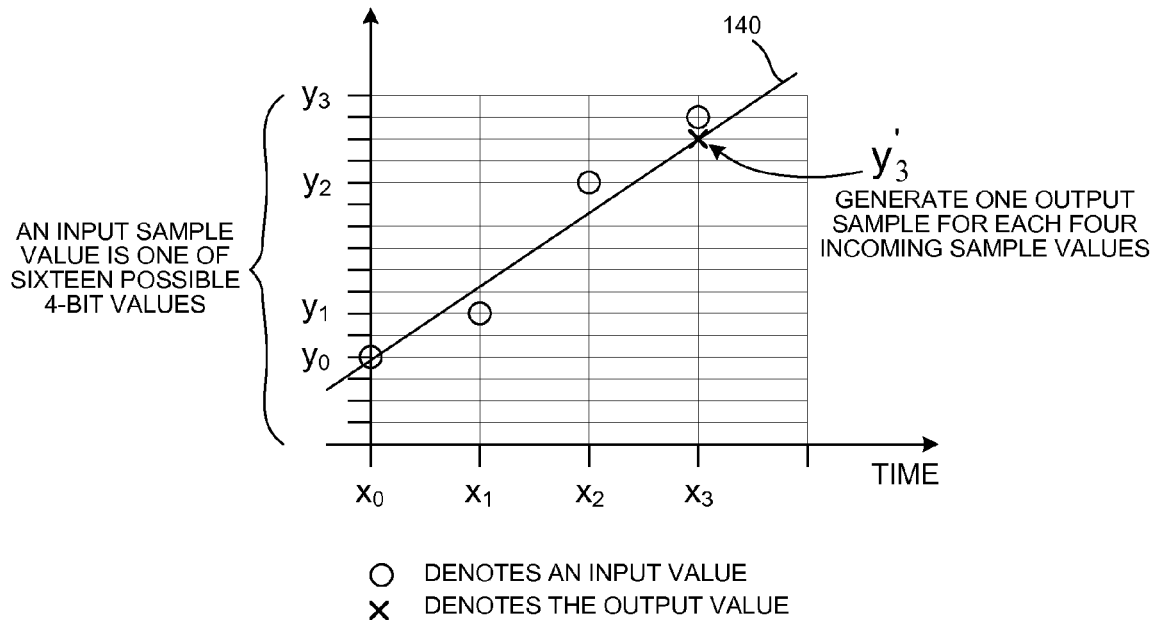
FIG. 8 is a diagram that illustrates an operation of one example of the downsampling circuitry 130 and 131 of the multi-rate DPLL 119 of FIG. 4.
FIG. 9 sets forth an equation usable to perform the downsampling operation performed by downsampling circuitry 130 and 131 of the multi-rate DPLL 119 of FIG. 4.

FIG. 8 is a diagram that illustrates operation of downsampling circuitry 130 and 131 that receives a higher sample rate signal X1(t) and outputs a lower sample rate signal X2(t). Each of the four incoming X1(t) values is a four-bit value. An incoming X1(t) value can therefore have one of the $2^4$ values indicated on the vertical axis of the graph of FIG. 8. In the illustrated example, the values $y_0$, $y_1$, $y_2$ and $y_3$ are four consecutive X1(t) values. From these four values, one four-bit output value $y'_3$ of X2(t) is generated using a least-squares estimate method. The least-squares method may be visualized as involving a line 140 that passes between the four incoming points. There is a difference between each input y value at its x time and the y value on line 140 at that same x time. This difference between the y value on the line and the input y value is squared. The sum of the four squared differences is minimized. The equation for the line 140 for which this least squares relation is true is then usable to generate the one X2(t) output value y'$_3$ from the four incoming values y$_0$, y$_1$, y$_2$ and y$_3$.

FIG. 9 sets forth a linear regression function usable to generate the X2(t) value from four incoming X1(t) values. This function is implemented in hardware in downsampling circuitry 130 and 131. The H(z) symbol block 130 and the down-arrow symbol block 131 are just schematic representations of the function being performed. In reality there is one circuit of combinatorial logic that carries out the operation set forth in equation form in FIG. 9.

Figures 10, 11, 12:
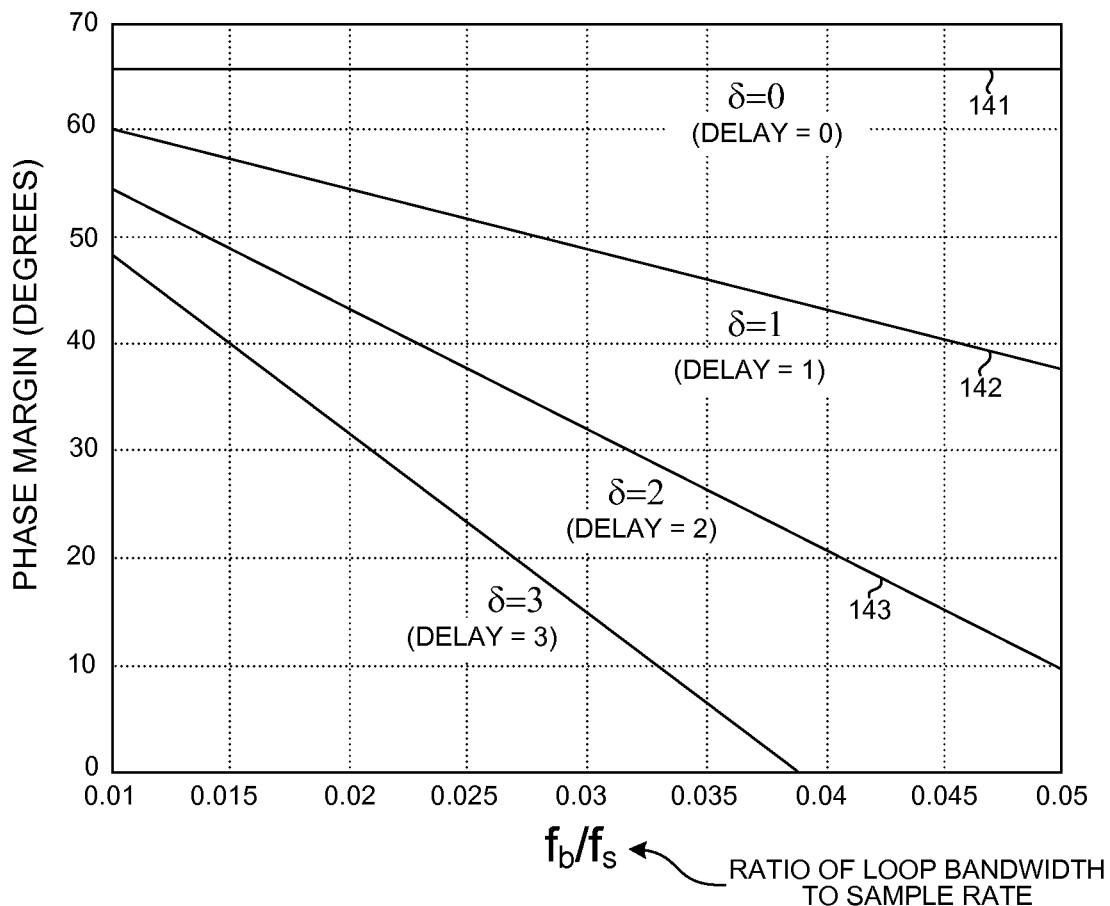
FIG. 10 sets forth an equation for the D(z) filter block 132 of the multi-rate DPLL 119 of FIG. 4.
FIG. 11 is a chart that illustrates how employing the multi-rate technique affects DPLL loop stability.
FIG. 12 is a table that compares phase error performance of a conventional DPLL to phase error performance of the multi-rate DPLL 119 of FIG. 4.

FIG. 10 sets forth the D(z) function of block 132 in the present example. Function D(z) delays each successive P1(t) value by four clock cycles. D(z) may, for example, be implemented as a set of four-bit shift registers, where each shift register delays a respective bit of the P1(t) value in order to generate a corresponding bit of P2(t).

FIG. 11 is a chart that illustrates how employing the multi-rate technique described above affects loop stability of the feed back loop of DPLL 119. The stability of a closed loop system such as DPLL 119 can be characterized by its phase margin and/or its gain margin. If the phase margin of the loop is too low, then the loop may be unable to reject disturbances and may be susceptible to oscillating. A larger phase margin indicates that the loop is more stable. FIG. 11 shows how DPLL phase margin degrades with increasing delay. The delay here is the delay introduced by the L(z) upsampling/interpolation operation and the H(z) downsampling/estimation operation. Generally speaking, the more complex and accurate the estimation and interpolation operations are, the larger delay there will be. Linear estimation and interpolation (as set forth above in connection with FIGS. 6-9) involves a relatively small delay of one but is generally less accurate than quadratic estimation and interpolation which would involve a delay of two. Line 141 represents no delay such as in a conventional DPLL involving no estimation or interpolation. Line 142 represents a delay of one. A delay of one corresponds to the use of linear estimation and linear interpolation, such as the linear estimation and linear interpolation employed in the multi-rate DPLL embodiment of FIGS. 5-9. Line 143 represents a delay of two. A delay of two would correspond to the use of a more accurate but calculation intensive quadratic estimation and quadratic interpolation. The f$_b$/f$_s$ of the horizontal axis of FIG. 11 is the ratio of DPLL loop bandwidth to sample rate. As sample rate increases, the f$_b$/f$_s$ quantity decreases, and the point of operation on the relevant line of FIG. 11 moves the left. Accordingly, a greater sample rate corresponds to an increase in phase margin and a better loop stability. In employing the multi-rate DPLL technique described here, the loop bandwidth, the delay, and the sample rate (of circuitry 138) are selected such that sample rate is decreased as much as possible while maintaining an acceptable phase margin for the DPLL application. DPLL loop bandwidth is generally set at around 40 KHz, and the rate at which control circuitry 138 is clocked (f$_{clk}$) is at least approximately ten times this 40 KHz frequency. Reducing the sample rate of circuitry 138 to this relative low frequency decreases power consumption as explained above.

FIG. 12 is a table that compares phase error performance of a conventional DPLL to phase error performance of multi-rate DPLL 119. The left column of the table indicates the sample rate of the control circuitry 138 as compared to the sample rate of the DCO and TDC. As indicated by the upper row of the table, the conventional DPLL has a phase RMS error of 0.16 degrees. As indicated by the second row of the table, multi-rate DPLL 119 that clocks control circuitry 138 at rate of one quarter the rate that the DCO and TDC are clocked has a phase RMS error of 0.10 degrees. The example of DPLL 119 described above in which f$_{clk}$ is clocked at one quarter the frequencies f$_{cdo}$ and f$_{tdc}$ is but an example set forth here for instructional purposes. An actual implementation would typically take more advantage of the power savings of the multi-rate approach. Frequency f$_{clk}$ may, for example, be 1.2 MHz which is one sixteenth of the 19.2 MHz f$_{cdo}$ and f$_{tdc}$ frequencies. The phase error values for this one sixteenth upsampling and downsampling example are set forth in the bottom row of FIG. 12.

Although the embodiment of the multi-rate DPLL described above involves use in the local oscillator of a transmitter, a multi-rate DPLL technique described here can also be employed in the local oscillator of a receiver. In one example, DPLL 119 of FIGS. 4 and 5 is part of the local oscillator 111 that supplies local oscillator signal LO1 to the mixer 109 of receive chain 108 of the RF transceiver integrated circuit 102 of FIG. 3. In the receive situation, there is no modulating signal M(t), the scaling factor K is zero, and no upsampling circuitry 136 and 137 is provided. Because there is no modulating signal M(t), the generation of digital images is much less of a problem than it is in the transmitter situation. DCO 124 can therefore be clocked at the slower rate of circuitry 138 in order to reduce power consumption. TDC 127 is clocked at the higher rate to keep quantization noise low.

Figure 13:
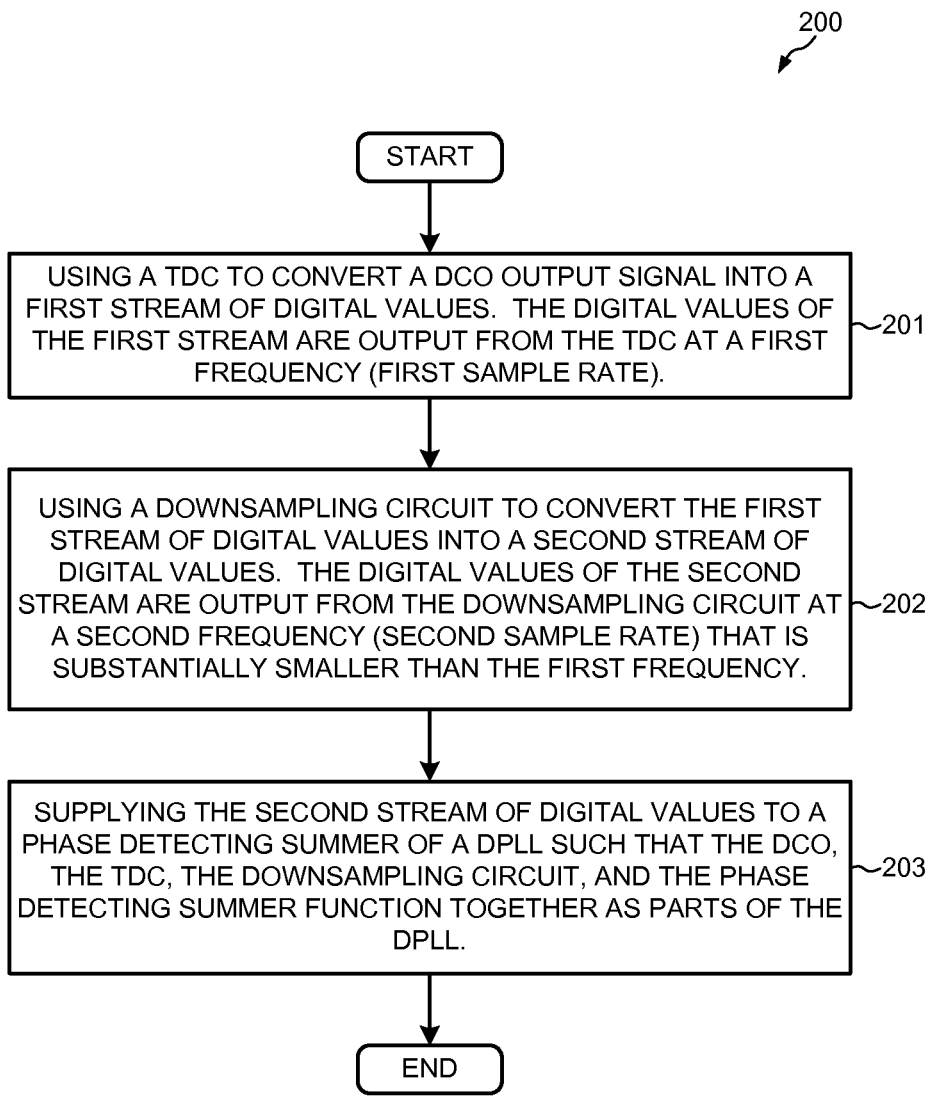
FIG. 13 is a flowchart of a method in accordance with one novel aspect.

FIG. 13 is a flowchart of a method 200 in accordance with one novel aspect. A TDC is used (step 201) to convert a DCO output signal into a first stream of digital values. The digital values of the first stream are output from the TDC at a first frequency. In one example, the DCO output signal is signal 125 of FIG. 4 and the first stream is stream X(t) of FIG. 4.

Next (step 202), downsampling circuitry converts the first stream of digital values as output from the TDC into a second stream of digital values, where the second stream of digital values are output from the downsampling circuitry at a second frequency that is substantially smaller than the first frequency. In one example, the second stream is stream X2(t) of FIG. 4 and the downsampling circuitry is circuitry 130 and 131 of FIG. 4.

Next (step 203), the second stream of digital values is supplied to a phase detecting summer of a DPLL such that the DCO, the TDC, the downsampling circuitry, and the phase detecting summer function together as parts of the DPLL. In one example, the phase detecting summer is phase detecting summer 133 of FIG. 4 and the DPLL is DPLL 119 of FIG. 4.

In a transmitter application, the method 200 involves upsampling circuitry 136 and 137. The DCO 124 is clocked at the higher first frequency to reduce digital images. In a receiver application, the method 200 involves no modulating signal M(t), a zero scaling factor K, and need not involve any upsampling circuitry. Because digital images are generally less of a problem in a receiver application, DCO 124 may be clocked at the lower second frequency to reduce power consumption further.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In one illustrative example, a set of processor-executable instructions 146 is stored in a memory (a processor-readable medium) 147 in digital baseband integrated circuit 103 of FIG. 2. Processor 148 accesses memory 147 across a bus and executes the instructions 146, thereby causing integrated circuit 103 to configure and control and monitor DPLL 119 in Local Oscillator 115 of the RF transceiver integrated circuit 102. In one example, execution of the instructions causes control parameters to be sent from processor 148, via the bus, through serial bus interface 149, serial bus 150, serial bus interface 151, and control conductors 152, to DPLL 119. These parameters set the coefficients of the digital filter H(z), set the coefficients of the digital filter L(z), set the frequency $f_{dco}$, set the frequency $f_{tdc}$, set the coefficients of the digital filter D(z), set the frequency of $f_{clk}$, set of scaling factor K, set the Frequency Command Word (FWC), and set the BAND setting. DPLL 119 is fully configurable via software in this manner and is controlled across serial bus 150. By the same mechanism, processor 148 configures, controls and monitors the multi-rate DPLL in local oscillator 111.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A Digital Phase-Locked Loop (DPLL) comprising:
a Digitally Controlled Oscillator (DCO) that outputs an oscillating DCO output signal, wherein the DCO output signal has a frequency, wherein the frequency of the DCO output signal changes at discrete times, and wherein the discrete times occur at a first frequency;
a feedback phase circuit that receives the DCO output signal and that outputs a first stream of feedback phase digital values;
a phase detecting summer that receives the first stream and receives a second stream of modulating signal phase digital values and that outputs a third stream of phase error digital values, wherein the phase error digital values of the third stream are output by the phase detecting summer at a second frequency, and wherein the second frequency is substantially smaller than the first frequency; and
a low pass filter that receives the third stream of phase error digital values and that outputs a fourth stream of filtered phase error digital values;
wherein the feedback phase circuit comprises:
a Time-to-Digital Converter (TDC) that receives the DCO output signal; and
downsampling circuitry that receives a stream of digital values from the TDC and outputs the first stream of feedback phase digital values to the phase detecting summer.

2. The DPLL of claim 1, wherein the feedback phase digital values of the first stream are output by the feedback phase circuit at the second frequency.

3. The DPLL of claim 1, further comprising:
a two-point modulation summer that receives the fourth stream of filtered phase error digital values and that outputs a fifth stream of digital tuning words, wherein the digital tuning words of the fifth stream are output by the two-point modulation summer at the second frequency; and
upsampling circuitry that receives the fifth stream of digital tuning words and outputs a sixth stream of digital tuning words, wherein the digital tuning words of the sixth stream are output by the upsampling circuitry at the first frequency.

4. The DPLL of claim 3, further comprising:
a modulating signal phase circuit that receives a seventh stream of modulating signal digital values and that outputs the second stream of modulating signal phase digital values.

5. The DPLL of claim 1, wherein the feedback phase circuit comprises downsampling circuitry that receives a stream of digital values and that outputs a downsampled stream of digital values, wherein the digital values of the downsampled stream of digital values are output by the downsampling circuitry at a frequency that is substantially smaller than the first frequency.

6. A Digital Phase-Locked Loop (DPLL) comprising:
a control circuit that receives a first stream of modulating signal digital values and that receives a second stream of feedback phase digital values and that outputs a third stream of digital tuning words, wherein the digital tuning words of the third stream are output by the control circuit at a first frequency;
upsampling circuitry that receives the third stream of digital tuning words and that outputs a fourth stream of digital tuning words;
a Digitally Controlled Oscillator (DCO) that receives the fourth stream of digital tuning words and that outputs an oscillating DCO output signal, wherein the DCO output signal has a frequency that changes at discrete times, wherein the discrete times occur at a second frequency, wherein the second frequency is substantially greater than the first frequency;
a Time-to-Digital Converter (TDC) that receives the DCO output signal and that outputs a fifth stream of digital values; and
downsampling circuitry that receives the fifth stream and that outputs the second stream of feedback phase digital values, wherein the feedback phase digital values of the second stream are output by the downsampling circuitry at the first frequency.

7. The DPLL of claim 6, wherein the control circuit comprises a phase accumulator, a phase detecting summer, a low pass filter, and a two-point modulation summer, wherein the third stream is output by the two-point modulation summer.

8. The DPLL of claim 7, wherein the phase accumulator is clocked at a frequency that is substantially smaller than the second frequency.

9. The DPLL of claim 7, wherein the DPLL is a part of a local oscillator, and wherein the local oscillator generates a local oscillator signal that is supplied to a mixer of a radio transmitter.

10. A Digital Phase-Locked Loop (DPLL) comprising:
a control circuit that receives a frequency command word and that receives a first stream of feedback phase digital values and that outputs a second stream of digital tuning words;
a Digitally Controlled Oscillator (DCO) that receives the second stream of digital tuning words and that outputs an oscillating DCO output signal;
a Time-to-Digital Converter (TDC) that receives the DCO output signal and that outputs a third stream of digital values, wherein the digital values of the third stream are output by the TDC at a first frequency; and
downsampling circuitry that receives the third stream and that outputs the first stream of feedback phase digital values, wherein the feedback phase digital values of the first stream are output by the downsampling circuitry at a second frequency that is substantially lower than the first frequency.

11. The DPLL of claim 10, wherein the control circuit comprises a phase accumulator, a phase detecting summer, a low pass filter, and a two-point modulation summer, wherein the second stream is output by the two-point modulation summer.

12. The DPLL of claim 11, wherein the phase accumulator is clocked at a frequency that is substantially smaller than the first frequency.

13. The DPLL of claim 11, wherein the DPLL is a part of a local oscillator, and wherein the local oscillator generates a local oscillator signal that is supplied to a mixer of a radio receiver.

14. A method comprising:
using a Time-to-Digital Converter (TDC) to convert an output signal of a Digitally Controlled Oscillator (DCO) into a first stream of digital values, wherein the digital values of the first stream are output by the TDC at a first frequency;
using a downsampling circuit to convert the first stream into a second stream of digital values, wherein the digital values of the second stream are output from the downsampling circuit at a second frequency, wherein the second frequency is substantially smaller than the first frequency; and
supplying the second stream of digital values to a phase detecting summer of a Digital Phase-Locked Loop (DPLL), wherein the DCO, the TDC, the downsampling circuit, and the phase detecting summer are parts of the DPLL.

15. The method of claim 14, further comprising:
using an upsampling circuit to supply a third stream of digital tuning words to the DCO, wherein the digital tuning words of the third stream are output from the upsampling circuit at a frequency that is substantially greater than the second frequency.

16. The method of claim 15, wherein the output signal of the DCO has a frequency, wherein the frequency of the DCO is changed at discrete times, and wherein the discrete times occur at the frequency that is substantially greater than the second frequency.

17. The method of claim 16, wherein the DPLL is a part of a local oscillator, wherein the local oscillator generates a local oscillator signal that is supplied to a mixer of a radio transmitter.

18. The method of claim 14, wherein the output signal of the DCO has a frequency, wherein the frequency of the DCO is changed at discrete times, and wherein the discrete times occur at a frequency that is substantially smaller than the first frequency.

19. The method of claim 18, wherein the DPLL is a part of a local oscillator, wherein the local oscillator generates a local oscillator signal that is supplied to a mixer of a radio receiver.

20. A circuit comprising:
a Digitally Controlled Oscillator (DCO) that outputs a DCO output signal;
a Time-to-Digital Converter (TDC) that receives the DCO output signal and that outputs a stream of digital values, wherein the digital values of the stream are output by the TDC at a first frequency; and
means for receiving the stream of digital values from the TDC and for supplying a stream of digital tuning words to the DCO such that a phase detecting summer outputs a stream of phase error values at a second frequency, wherein the second frequency is substantially smaller than the first frequency, and wherein the DCO, the TDC, the phase detecting summer, and the means function together as a Digital Phase-Locked Loop (DPLL).

21. The circuit of claim 20, wherein the phase detecting summer is a part of the means.

22. The circuit of claim 21, wherein the means is for downsampling the stream of digital values output by the TDC and for supplying a downsampled stream of feedback phase digital values to the phase detecting summer.

23. The circuit of claim 21, wherein the means is for upsampling a stream of digital values to generate the stream of digital tuning words that is supplied to the DCO.

24. A computer program product, comprising:
a non-transitory computer-readable medium comprising:
code for causing a computer control a multi-rate Digital Phase-Locked Loop (DPLL), wherein the multi-rate DPLL includes a Time-to-Digital Converter (TDC) that receives a (Digitally Controlled Oscillator) DCO output signal and that outputs a first stream of digital values at a first frequency, wherein the multi-rate DPLL includes a downsampling circuit that receives the first stream of digital values from the TDC and outputs a second stream of digital values at a second frequency, and wherein the second stream is supplied to a phase detecting summer of the multi-rate DPLL.

25. The computer program product of claim 24, wherein the computer is a processor in a first integrated circuit, wherein the computer-readable medium is a memory within the first integrated circuit that is accessible by the processor, wherein the DPLL is disposed in a second integrated circuit, and wherein the code causes the computer to control the DPLL at least in part by sending a control parameter across a serial bus from the first integrated circuit to the second integrated circuit.

26. The computer program product of claim 24, wherein the code controls the multi-rate DPLL at least in part by causing a control parameter to be sent across a serial bus.

27. The computer program product of claim 26, wherein the control parameter is used to set the first frequency.

28. The computer program product of claim 26, wherein the control parameter is used to configure the downsampling circuit.

29. The computer program product of claim 26, wherein the control parameter is used to set the second frequency.

30. An apparatus comprising:

means for converting an output signal of a Digitally Controlled Oscillator (DCO) into a first stream of digital values, wherein the digital values of the first stream are output by the means for converting the output signal at a first frequency;

means for converting the first stream into a second stream of digital values, wherein the digital values of the second stream are output from the means for converting the first stream at a second frequency, wherein the second frequency is substantially smaller than the first frequency; and means for supplying the second stream of digital values to a phase detecting summer of a Digital Phase-Locked Loop (DPLL), wherein the DCO, the means for converting the output signal, means for converting the first stream, and the phase detecting summer are parts of the DPLL.

* * * * *